United States Patent [19]

Seki et al.

[11] Patent Number: 4,503,478
[45] Date of Patent: Mar. 5, 1985

[54] TRANSISTOR POWER AMPLIFIER CIRCUIT

[75] Inventors: Kunio Seki, Tokyo; Ritsuji Takeshita, Hino, both of Japan

[73] Assignee: Hitachi, Ltd., Tokyo, Japan

[21] Appl. No.: 52,207

[22] Filed: Jun. 26, 1979

[30] Foreign Application Priority Data

Jul. 26, 1978 [JP] Japan ............................. 53-90471

[51] Int. Cl.³ ............................................... H02H 7/20
[52] U.S. Cl. ...................................... 361/79; 361/98; 330/207 P
[58] Field of Search ................. 361/93, 94, 98, 100, 361/101, 79, 90, 91; 330/207 P, 298

[56] References Cited

U.S. PATENT DOCUMENTS

| | | | |
|---|---|---|---|
| 3,441,864 | 4/1969 | Hafler | 330/298 |
| 3,691,427 | 9/1972 | Honda et al. | 330/207 P |
| 3,835,412 | 9/1974 | Honda et al. | 330/298 |
| 4,053,996 | 10/1977 | Schertz et al. | 330/207 P X |
| 4,146,847 | 3/1979 | Otao et al. | 330/298 X |
| 4,184,187 | 1/1980 | Suzuki | 361/90 |

FOREIGN PATENT DOCUMENTS

| | | |
|---|---|---|
| 1236449 | 6/1971 | United Kingdom . |
| 1238950 | 7/1971 | United Kingdom . |
| 1448836 | 9/1976 | United Kingdom . |
| 1475389 | 6/1977 | United Kingdom . |

Primary Examiner—Patrick R. Salce
Attorney, Agent, or Firm—Antonelli, Terry & Wands

[57] ABSTRACT

Two output transistors constituting a push-pull output amplifier circuit are connected in series between a power supply and a grounded point, and an output terminal is disposed at a point where the two output transistors are commonly connected. An operation detector circuit detects the operation of one output transistor. A level detector circuit detects a d-c voltage level at the output terminal. The two output transistors are driven by a drive circuit in a push-pull manner. The output of the operation detector circuit and the output of the level detector circuit control the drive circuit via a control circuit. When the operation detector circuit detected the fact that the operation of one output transistor has deviated beyond a predetermined detection level, the control circuit works to confine the operation of the abovementioned output transistor within a predetermined restriction level via the drive circuit. The power loss in the restriction level is smaller than the power loss in the detection level. During a period in which the output terminal is short-circuited to the grounded point in a d-c manner, the level detector circuit so controls the control circuit that the operation of the abovementioned one output transistor is confined within the restriction level.

8 Claims, 5 Drawing Figures

TRANSISTOR POWER AMPLIFIER CIRCUIT

BACKGROUND OF THE INVENTION

The present invention relates to a transistor power amplifier circuit including a push-pull output circuit.

Output transistors used in a transistor power amplifier circuit must be operated within an ASO (Area of Safety Operation) region so that permanent secondary breakdown is not developed in the collector/emitter voltage $V_{CE}$-collector current Ic characteristics. If the operation of the transistor moves out of the ASO region, the transistor develops secondary breakdown and is permanently destroyed.

If the temperature at the collector/base junction of the transistor increases above a maximum junction temperature, thermal runaway is developed in the collector current whereby secondary breakdown develops on the transistor. The temperature at the collector/base junction of the transistor varies in proportion to the power loss at the collector/base junction.

On the other hand, the power loss of the transistor is equal to the root-mean-square value of the product of the voltage $V_{CE}$ across the collector and emitter and the collector current Ic. Therefore, the d-c power loss Pd(DC) of a transistor which operates on a constant collector/emitter voltage $V_{CE}$ and on a constant collector current Ic, is greater than the a-c power loss Pd(AC) of a transistor which operates on an instantaneous collector/emitter voltage $V_{CE}$ and on an instantaneous collector current Ic.

Figure 4:
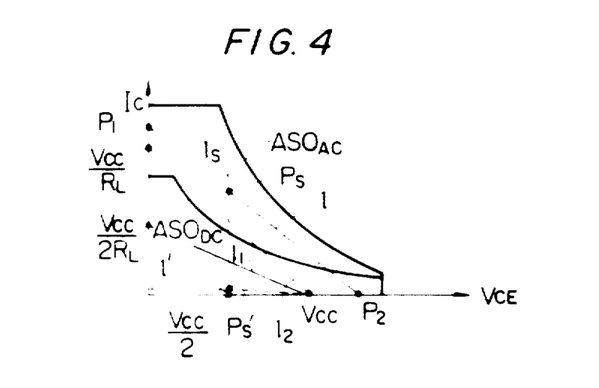
FIG. 4 is a diagram showing a-c and d-c safety operation regions on the collector/emitter voltage-collector current characteristics of a transistor, as well as operation locus of a push-pull circuit under clipped condition.

Accordingly, referring to the collector/emitter voltage $V_{CE}$—collector current Ic characteristics of a transistor as shown in FIG. 4, a d-c ASO region $ASO_{DC}$ in which the transistor operates on a constant voltage $V_{CE}$ and on a constant current Ic is narrower than an a-c ASO region $ASO_{AC}$ in which the transistor operates on an instantaneous value $V_{CE}$ and on an instantaneous value Ic.

Referring to a push-pull output circuit which operates on a positive power-supply voltage Vcc and which drives a load resistor $R_L$ via an output coupling capacitor, on the other hand, it is accepted practice that two output transistors connected in series across a power-supply voltage Vcc and the ground potential GND are so biased in a d-c manner that a voltage of about Vcc/2 is applied across the collector and emitter of each of the transistors when no a-c signals are introduced.

When an output voltage swing of the above push-pull output circuit is raised and lowered responsive to the input signals with the d-c operation level of Vcc/2 as a center, and when the input signals do not cause the voltage to rise to the power-supply voltage Vcc and do not, either, cause the voltage to lower to the ground potential GND, the output of the push-pull amplifier circuit acquires a non-clipped state. Under the non-clipped output condition, the locus of operation determined by the collector/emitter voltage $V_{CE}$—collector current Ic characteristics of a single output transistor does not exceed a straight line $l_1$ connecting the two operation points $$\left[ O(V), \frac{Vcc}{2R_L}(A) \right]$$

and [Vcc(V), O(A)], as shown in FIG. 4.

On the other hand, when excessive input signals are applied, the two output transistors are alternately rendered conductive and nonconductive responsive to the input signals. Therefore, the output of the push-pull output amplifier circuit is raised up to the power-supply voltage Vcc and is lowered to the ground potential GND responsive to the input signals, thereby to produce pulse waveforms clipped between the two voltage levels. Under the clipped condition, the two output transistors perform switching operation between the two levels, i.e., between the power-supply voltage Vcc and the ground potential GND. However, the locus of operation of a single output transistor under the clipped output condition does not exceed a straight line $l_2$ connecting the two operation points $$\left[ O(V), \frac{Vcc}{R} \right].$$

[Vcc(V), O(A)] as shown in FIG. 4.

Therefore, in the case of the a-c operation of the output transistor of the push-pull output circuit, the operation locus may fall outside the a-c ASO region $ASO_{AC}$ due to a variety of causes, giving rise to the occurrence of permanent secondary breakdown on the output transistor. If the base current of the output transistor is so controlled that the operation locus of the output transistor is confined within a restriction level l in the a-c ASO region $ASO_{AC}$, it is possible to prevent the output transistor from being permanently broken down. For this purpose, a protecting circuit must detect any operation locus of the output transistor which has fallen outside the level l, and must further so control the base current of the output transistor that the operation locus of the output transistor is confined within the level l.

In order to increase a maximum output power of the transistor power amplifier circuit including the push-pull output circuit, on the other hand, the detection-restriction level l and the operation locus $l_2$ under the clipped condition must be brought as close as possible to a limit line of the a-c ASO region $ASO_{AC}$.

Through a study conducted by the inventors of the present invention, it has become clear that when the detection-restriction level l of the protecting circuit for protecting the output transistor and the a-c operation locus $l_2$ under the clipped condition come very close to the limit line of the a-c ASO region $ASO_{AC}$, the output transistor of the transistor power amplifier circuit is very likely to develop permanent secondary breakdown.

That is, when the output terminals of the push-pull output circuit are short-circuited in a d-c manner, the operation locus $ls$ of the d-c short-circuited can be diagramatized in FIG. 4. Due to the detection-restriction level l of the protecting circuit, on the other hand, the d-c operation point Ps of the output transistor when the output terminals are short-circuited in a d-c manner is restricted to a point at which the detection-restriction level l meets the operation locus $ls$ when the output terminals are short-circuited in the d-c manner, as shown in FIG. 4.

As will be considered from FIG. 4, however, the d-c operation point Ps when the output terminals are short-circuited in the d-c manner is likely to be located outside the d-c ASO region $ASO_{DC}$. In such a case, the temperature at the collector/base junction of the output transistor will exceed a maximum junction temperature, giving rise to the occurrence of permanent secondary breakdown.

SUMMARY OF THE INVENTION

The object of the present invention therefore is to provide a transistor power amplifier circuit which is capable of protecting the output transistors even against the short-circuit of the output terminals in the d-c manner.

To achieve the abovementioned object, the most fundamental feature of the invention resides in that the detection level of the protecting circuit for protecting the output transistors is set to be different from the restriction level thereof, and the power loss at the restriction level caused by the operation of the protecting circuit is set to be smaller than the power loss at the detection level. According to a preferred embodiment, the power loss at the restriction level is set to be smaller than the power loss in the d-c ASO region. According to a more preferred embodiment, the output transistor is cut off when the operation locus of the output transistor exceeds the detection level, whereby the power loss at the restriction level is minimized.

DESCRIPTION OF THE PREFERRED EMBODIMENTS

The invention is particularly mentioned below with reference to various preferred embodiments.

Figure 1:
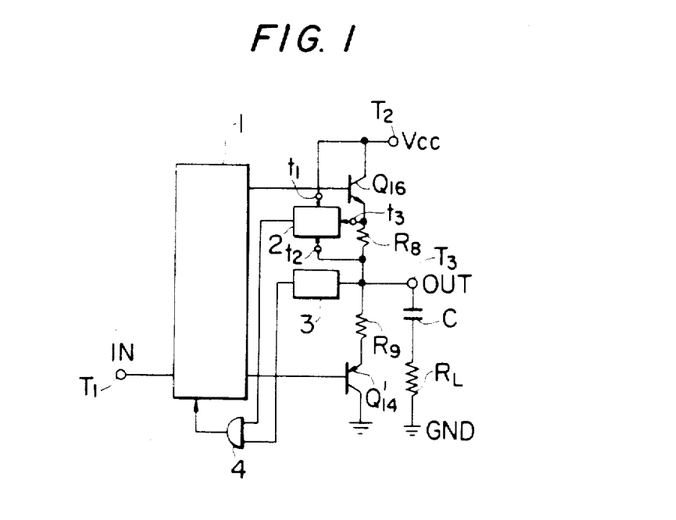
FIG. 1 is a circuit diagram showing a transistor power amplifier circuit according to an embodiment of the present invention.

FIG. 1 is a circuit diagram of a transistor power amplifier circuit according to an embodiment of the present invention.

Transistors $Q_{16}$ and $Q_{14}'$ constitute a push-pull output circuit. When no a-c signals are being introduced, the collector and emitter of each of the transistors $Q_{16}$ and $Q_{14}'$ are so biased in a d-c manner that a voltage of about $V_{cc}/2$ which is one-half of the power-supply voltage $V_{cc}$ is impressed thereto.

Reference numeral 1 represents a drive circuit for driving push-pull output transistors $Q_{16}$ and $Q_{14}'$, which is composed of a large-amplitude class-A amplifier circuit and a biasing circuit.

Reference numeral 2 represents an operation detector circuit. The voltage across the collector and emitter of the output transistor $Q_{16}$ is applied to terminals $t_1$ and $t_2$, and a signal converted from the emitter current which is nearly equal to the collector current by means of a resistor $R_8$ is applied to a terminal $t_3$, such that a detection level 1 is set within an a-c ASO region $ASO_{AC}$ as shown in FIG. 4.

Reference numeral 3 denotes a d-c voltage detector circuit. When there is no abnormal condition such as d-c short-circuiting of an output terminal $T_3$, the d-c voltage at the output terminal $T_3$ of the push-pull output circuit acquires a value of nearly $V_{cc}/2$.

According to this embodiment, the operation detector circuit 2 produces an output signal of a logical level "1" when the operation locus of the output transistor $Q_{16}$ is within the detection level 1, and the d-c voltage detector circuit 3 produces an output signal of the logical level "1" when the d-c voltage of the output terminal $T_3$ is nearly $V_{cc}/2$.

An AND circuit 4 to which will be applied the outputs of the abovementioned two detector circuits constitutes a control circuit. The drive circuit 1 is controlled by the output of the level "0" of the AND circuit 4, and both of the output transistors $Q_{16}$ and $Q_{14}'$ are rendered non-conductive.

Below is mentioned the operation of the above circuit. When the push-pull output transistor $Q_{16}$ is operating within the detection level 1, the detection output of the operation detector circuit 2 and the detection output of the d-c voltage detector circuit 3 acquire a logical level "1", whereby the AND circuit 4 produces an output of the logical level "1". In this case, the drive circuit 1 drives the output transistors $Q_{16}$ and $Q_{14}'$ responsive to an input signal IN applied to an input terminal $T_1$.

When the output terminal $T_3$ is short-circuited to the ground potential in the d-c manner due to short-circuit in the load or the like, the operation locus of the output transistor $Q_{16}$ falls outside the detection level 1. Hence, the detection output of the detector circuit 2 is changed from the logical level "1" to the logical level "0", so that the output of the AND circuit 4 correspondingly acquires the logical level "0". Consequently, the drive circuit 1 causes the output transistors $Q_{16}$ and $Q_{14}'$ to be nonconductive. Therefore, the detection output of the operation detector circuit 2 is restored to the level "1". However, so far as the output terminal $T_3$ is short-circuited to the ground potential GND in the d-c manner, the potential of the output terminal $T_3$ remains to be nearly that of the ground potential, and the detection output of the d-c voltage detector circuit 3 acquires the level "0". Due to the level "0" of the detector circuit 3, the output of the AND circuit 4 acquires the level "0", such that the output transistors $Q_{16}$ and $Q_{14}'$ are maintained in the nonconductive state.

According to this embodiment, therefore, the detection level 1 of the operation detector circuit 2 has been set to lie in the a-c ASO region $ASO_{AC}$ as shown in FIG. 4. Hence, when the output terminal $T_3$ is short-circuited to the ground potential GND in the d-c manner, causing the operation locus of the output transistor $Q_{16}$ to exceed the detection level 1, the output transistors $Q_{16}$ and $Q_{14}'$, are controlled to operate within a restriction level $1'$ in which the power loss is very much smaller than the power loss in the detection level 1 as shown in FIG. 4. The power loss in the restriction level $1'$ has been set to a value smaller than the power loss in the d-c ASO region $ASO_{DC}$. Therefore, the output transistors $Q_{16}'$ and $Q_{14}'$ are controlled to a cut off state. Consequently, the restriction level $1'$ is made to correspond to a leakage current $I_{CEO}$ between the collector and the emitter when the base of the transistor is opened.

When the output terminal $T_3$ is short-circuited to the ground potential GND in a d-c manner, the d-c operation point Ps' is located in the d-c ASO region $ASO_{DC}$ of the output transistor as shown in FIG. 4. It is therefore allowed to protect the output transistor $Q_{16}$ from being permanently broken down.

According to this embodiment, a leakage current is supplied from the power supply Vcc to the output terminal $T_3$ owing to the ASO protecting circuit 2. Hence, when the abovementioned short-circuited state is discontinued, a d-c blocking capacitor C or a parasitic capacitance connected to the output terminal OUT is electrically charged through the abovementioned leakage current circuit; the d-c potential at the output terminal $T_3$ rises to Vcc/2.

Owing to the rise of the d-c voltage, the detection output of the detector circuit 3 acquires the level "1". On the other hand, since the detection output of the detector circuit 2 has already been restored to the level "1", the output of the AND circuit 4 acquires the level "1", so that the output transistors $Q_{16}$ and $Q_{14}'$ are automatically liberated from the nonconductive state. A complicated automatic restoration circuit will be needed when it is desired to maintain the output transistors $Q_{16}$ and $Q_{14}'$ in the nonconductive state by applying the detection output to a latch circuit. In this regard, therefore, the embodiment of the present invention is advantageous, also.

According to this embodiment, further, when the detection output of the detector circuit 2 acquires the level "0" with respect to the short-circuited output terminal as a result of the short-circuiting across the load resistor $R_L$ connected to the d-c blocking capacitor C, the output of the AND circuit acquires the level "0" and the output transistors $Q_{16}$, $Q_{14}'$ are rendered nonconductive. Since the output level of the detector circuit 3 remains in the level "1" with respect to the short-circuiting of the output terminal $T_3$ to the ground potential GND in an a-c manner, the turn-off of the output transistors $Q_{16}$, $Q_{14}'$ causes the detection output of the detector circuit 2 to acquire the level "1", whereby the output of the AND circuit acquires the level "1". Therefore, the output transistors $Q_{16}$ and $Q_{14}'$ operate again. Thus, the abovementioned operation is repeated for each of the alternately occurring short-circuiting of output.

Figure 2:
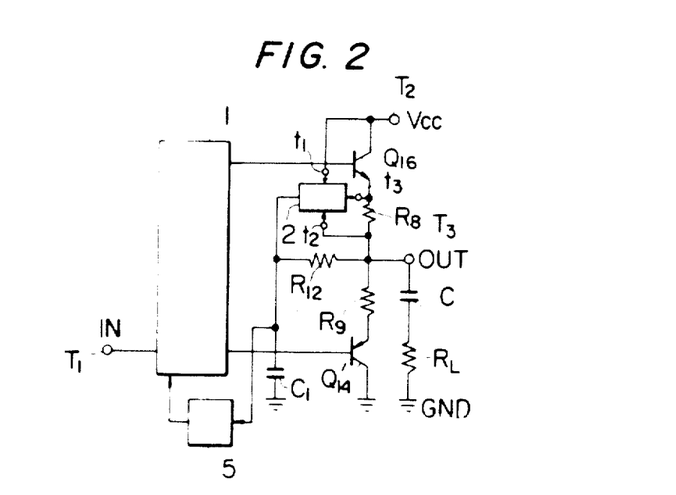
FIG. 2 is a circuit diagram showing a transistor power amplifier circuit according to another embodiment of the present invention.

According to an embodiment shown in FIG. 2, the repeating period can be extended, and the d-c voltage detector circuit can be constructed in a simplified manner.

According to this embodiment, the d-c voltage detector circuit 3 consists of a time-constant circuit made up of a resistor $R_{12}$ and a capacitor $C_1$ connected between the output terminal $T_3$ and the ground potential GND; the output voltage of the capacitor C is applied via the resistor $R_{12}$. The charging voltage of the capacitor $C_1$ is applied to a Schmidt trigger circuit 5, and the output transistors $Q_{16}$ and $Q_{14}'$ are rendered nonconductive by controlling the drive circuit 1 by means of the output of the Schmidt trigger circuit 5.

With this embodiment, the detector circuit 2 is operated when the output terminals are short-circuited in the d-c manner, whereby the Schmidt trigger circuit 5 is reversed to control the drive circuit 1, and the output transistors $Q_{16}$ and $Q_{14}'$ are rendered conductive. So far as the output terminals are short-circuited in the d-c manner, the capacitor $C_1$ is not electrically charged by the leakage current through the detector circuit 2 and the resistor $R_{12}$. Under this condition, since the Schmidt trigger circuit 5 retains the abovementioned reversed state, the protecting operation is continuously maintained.

On the other hand, when output terminals are liberated from the d-c short-circuited state, the capacitor $C_1$ is electrically charged by the leakage current which flows through the detector circuit 2 and the resistor $R_{12}$; the Schmidt trigger circuit 5 is reversed again, and the amplification operation is automatically restored.

When the output terminal is short-circuited in the a-c manner, the abovementioned repetitive operation is defined by the hysteresis level of the Schmidt trigger circuit 5, and by the time constant determined by the resistor $R_{12}$ and the capacitor $C_1$. Hence, the period of repetition is lengthened, and less electric power is consumed by the output transistors $Q_{16}$ and $Q_{14}'$. According to this embodiment, also, the detection level 1 of the detector circuit 2 can be brought near the limit of the a-c ASO region $ASO_{AC}$, making itself very useful for materializing a power amplifier circuit of high power output.

Further, the circuit according to this embodiment consists of the ASO detector circuit of the embodiment shown in FIG. 1 to which are added the capacitor $C_1$, the resistor $R_{12}$ and the Schmidt trigger circuit 5. Therefore, the circuit setup can be simplified.

Figure 3:
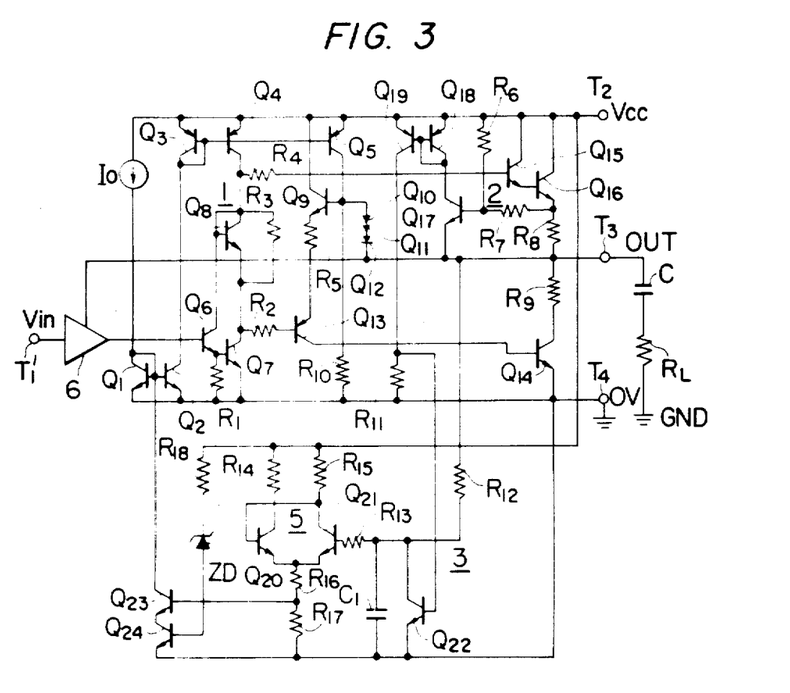
FIG. 3 is a circuit diagram showing a transistor power amplifier circuit according to a concrete embodiment of the present invention.

FIG. 3 is a circuit diagram showing a specific embodiment according to the present invention, which is constructed in the form of a monolithic power integrated circuit.

Large-amplitude class-A amplifier transistors $Q_6$ and $Q_7$ are Darlington-connected and are served with outputs which have been converted into current signals through a pre-amplifier 6.

A quasi-complementary push-pull output circuit is constituted by transistors $Q_{15}$, $Q_{16}$, $Q_{13}$ and $Q_{14}$, which receive output voltages of large amplitudes from the transistors $Q_6$ and $Q_7$.

A circuit for biasing the output transistors $Q_{13}$, $Q_{15}$ is constituted by a transistor $Q_8$ which is diode-connected between the bases of the transistors $Q_{13}$, $Q_{15}$, by a transistor $Q_9$ connected to the emitter of the transistor $Q_{13}$, and by diodes $Q_{10}$ to $Q_{12}$.

Further, a constant-current load is constituted by a transistor $Q_4$ connected to the collectors of the transistors $Q_6$, $Q_7$ in the drive stage.

The transistor $Q_5$ of which the base is commonly connected together with the base of the transistor $Q_4$ supplies a constant current to the diodes $Q_{10}$ to $Q_{12}$ which constitute the abovementioned biasing circuit.

These transistors $Q_4$ and $Q_5$ are driven by a diode-connected transistor $Q_3$. The diode-connected transistor $Q_3$ receives constant-current outputs from transistors $Q_1$ and $Q_2$ which constitute a current mirror circuit which receives a current from a constant-current circuit Io.

A detector circuit for detecting the operation (voltage across the collector and emitter, and collector current or emitter current) of the output transistor $Q_{16}$ is constituted by voltage-dividing resistors $R_6$ and $R_7$ connected across the collector and emitter of the output transistor $Q_{16}$, by an emitter resistor $R_8$, and by a transistor $Q_{17}$. The collector output of the transistor $Q_{17}$ is supplied to a current mirror circuit consisting of transistors $Q_{18}$ and $Q_{19}$, and the output current of the current mirror circuit is allowed to flow into a resistor $R_{11}$. A transistor $Q_{22}$ is actuated by a voltage produced by the resistor $R_{11}$. The transistor $Q_{22}$ establishes a circuit for electrically discharging a capacitor $C_1$ which constitutes a time-constant circuit.

A resistor $R_{12}$ for detecting the d-c voltage has been connected between the capacitor $C_1$ and the output terminal $T_3$, thereby to constitute a time-constant circuit together with the capacitor $C_1$.

A Schmidt trigger circuit is constituted by transistors $Q_{20}$, $Q_{21}$ of which the emitters have been commonly connected, by collector resistors $R_{14}$, $R_{15}$, and by emitter resistors $R_{16}$, $R_{17}$. The Schmidt trigger circuit produces an output with hysteresis characteristics at a connection point between the resistor $R_{16}$ and the resistor $R_{17}$ relying upon different emitter currents of the transistors $Q_{20}$, $Q_{21}$ which operate depending upon the resistances of collector resistors $R_{14}$ and $R_{15}$.

A transistor $Q_{23}$ which receives a voltage divided by the above resistors $R_{16}$ and $R_{17}$, provides a protecting function.

During the protecting operation, the protecting transistor $Q_{23}$ is rendered conductive, whereby its collector works to short-circuit the base and collector of the transistor $Q_1$ on the input side of the constant-current circuit and renders the transistor $Q_1$ nonconductive. With the transistor $Q_1$ being nonconductive, the constant-current transistors $Q_4$ and $Q_5$ are rendered nonconductive, and the output transistors $Q_{16}$ and $Q_{14}$ are also rendered nonconductive.

In this embodiment, immediately after the power supply Vcc is turned on, the d-c detection output will be of the level of ground potential like the case when the d-c load is short-circuited. Hence, when the protecting circuit is operated, the output terminal $T_3$ may exhibit poor response in output potential with the rise in power supply. Such a condition may develop when the load $R_L$ is connected to the output terminal $T_3$ via a d-c blocking capacitor C, or when a capacitive load is connecter thereto. In order to prevent the above condition, therefore, a Transistor $Q_{24}$ should be connected in series with the protecting transistor $Q_{23}$, and should be controlled by way of power-supply voltage detector means made up of a Zener diode ZD. Namely, before the power-supply voltage Vcc reaches a predetermined voltage $V_Z$ of the Zener diode ZD, the transistor $Q_{24}$ is turned off in order to prevent the erroneous operation of the protecting circuit when the power supply is turned on.

In the abovementioned embodiment, the output transistor $Q_{14}$ is also rendered nonconductive during the protecting operation, because it is necessary to perform the abovementioned automatic restoration operation when the d-c short-circuited condition is discontinued.

The present invention should be no means be restricted to the aforementioned embodiments only. In the circuit of FIG. 1, for instance, the AND circuit 4 may be replaced by an OR circuit, a NAND circuit, a NOR circuit, or the like depending upon the level for detecting the operation of the output transistor or the level for detecting the d-c voltage. Further, referring to the circuit of FIG. 2, the Schmidt trigger circuit may simply be a voltage comparator circuit.

Moreover, the operation detector circuit 2 may be variously modified, and the push-pull output circuit and the drive circuit therefor can also be varied in a variety of ways.

Figure 5:
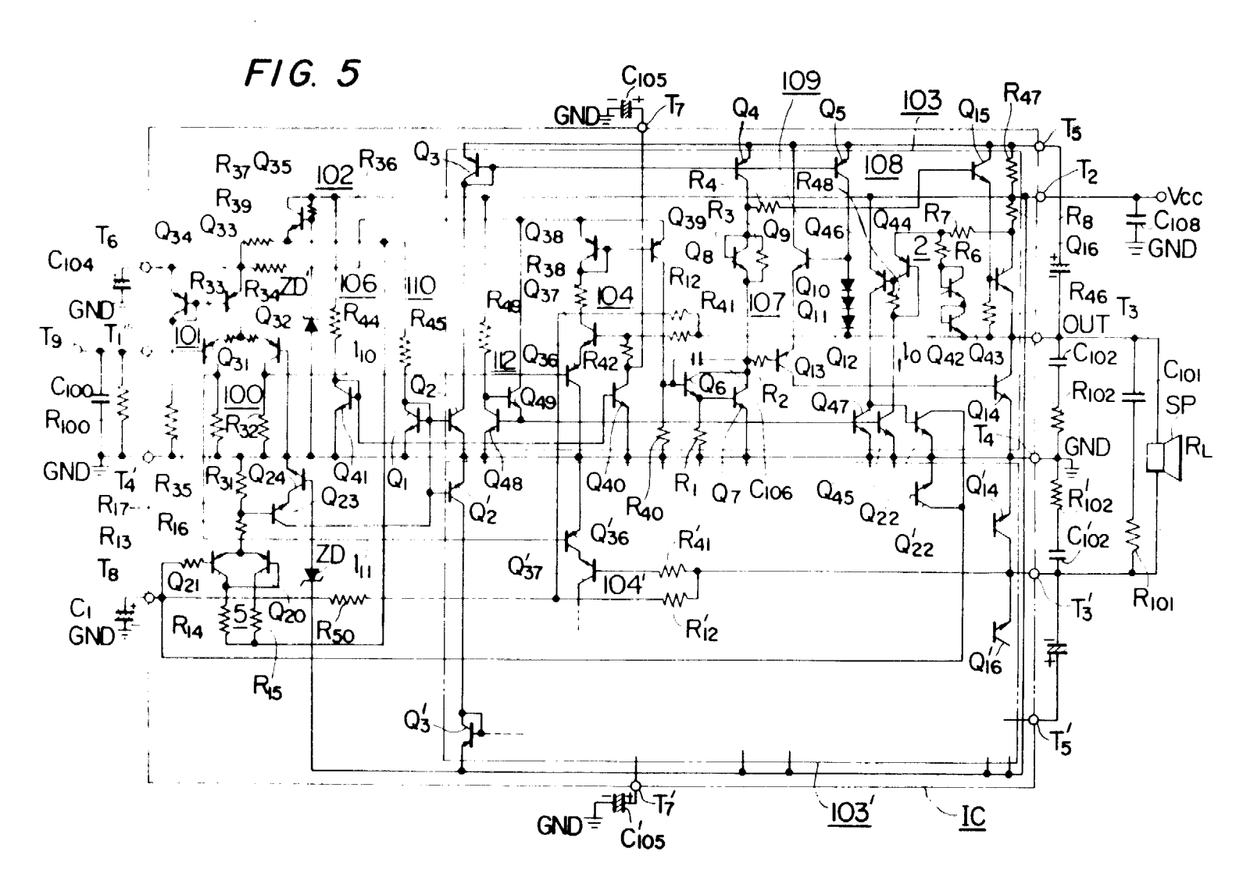
FIG. 5 shows a BTL circuit in which the transistor power amplifier circuit according to the modified embodiment of FIG. 3 is constructed in the form of a monolithic semiconductive integrated circuit.

FIG. 5 shows an embodiment in which the protecting circuit of the present invention is applied to a BTL (Balanced Transformer-Less) circuit made up of a push-pull output amplifier circuit in the form of a monolithic semiconductive integrated circuit according to the modified embodiment of FIG. 3.

The circuit elements surrounded by the broken line in the drawing have all been formed in a single silicon chip by way of a customary method of making semiconductive integrated circuits.

An input signal applied to an input terminal $T_9$ is transmitted to an input terminal $T_1'''$ of the integrated circuit. A differential phase separator circuit 100 made up of transistors $Q_{31}$ to $Q_{33}$ and resistors $Q_{31}$ to $R_{34}$, works in response to the signals at its input and produces two output signals of anti-phase relation onto two signal lines $l_{10}$ and $l_{11}$. A value of constant current flowing through the constant-current transistor $Q_{33}$ of the differential phase separator circuit 100 is determined by a biasing current which flows in a biasing circuit 101 made up of a transistor $Q_{34}$ and a resistor $R_{35}$.

A constant-voltage Zener diode ZD', a resistor $R_{36}$ and a transistor $Q_{35}$ constitute a constant-voltage regulator 102 which generates an operation voltage of nearly a constant value irrespective of the power-supply voltage Vcc fed to the power-supply terminal $T_2$.

The operation voltage is fed to the differential phase separator circuit 100 and to the biasing circuit 101 via a resistor $R_{37}$.

Reference numerals 103 and 103' represent a pair of power amplifier circuits of the BTL circuit type for directly driving the speaker SP without interposing any output coupling capacitors. The pair of power amplifier circuits 103, 103' have been constructed quite in the same manner. Therefore, only one power amplifier circuit 103 is specifically illustrated, and the other circuit 103' is not illustrated.

The speaker SP is directly connected between a pair of output terminals $T_3$, $T_3'$ of the pair of power amplifier circuits 103 and 103'.

To prevent oscillation, a series circuit consisting of a capacitor $C_{101}$ and a resistor $R_{101}$ is connected in parallel with the speaker SP, a series circuit consisting of a capacitor $C_{102}$ and a resistor $R_{102}$ is connected between an output terminal $T_3$ and a ground terminal $T_4$, and further a series circuit consisting of a capacitor $C_{102}'$ and a resistor $R_{102}'$ is connected between an output terminal $T_3'$ and the ground terminal $T_4$.

Bootstrap capacitors $C_{103}$ and $C_{103}'$ have been connected between output terminals $T_3$, $T_3'$ and bootstrap terminals $T_5$, $T_5'$, respectively.

The two signals sent onto the two signal lines $l_{10}$ and $l_{11}$ are applied to the bases of transistors $Q_{36}$, $Q_{36}'$ in the initial-stage amplifier circuits 104, 104' of the pair of power amplifier circuits 103 and 103'.

Although not sepcifically restricted thereto, the initial-stage amplifier circuit 104 includes a modified differential amplifier circuit consisting of transistors $Q_{36}$, $Q_{37}$ and a resistor $R_{38}$, a current mirror circuit consisting of transistors $Q_{38}$ and $Q_{39}$, and a load consisting of the resistor $R_{40}$ as shown. A nearly constant operation voltage is applied by a constant-voltage regulator 102 to the initial-stage amplifier circuit 104 via a resistor $R_{39}$. One end of the resistor $R_{39}$ is connected to a filter capacitor $C_{104}$ for removing power-supply rippling via a terminal $T_6$, whereby the differential phase separator circuit 101 is allowed to very stably operate.

An output OUT produced from an output terminal T₃ of the power amplifier circuit 103 is transmitted to the base of the transistor Q₃₇ of the initial-stage amplifier circuit 104 via a negative feedback circuit 105 consisting of resistors R₄₁, R₄₂, a constant-current transistor Q₄₀, and a capacitor C₁₀₅ connected to a terminal T₇, whereby an a-c voltage gain of the power amplifier circuit 103 is determined, and a d-c output voltage level at the output terminal T₃ of the power amplifier circuit 103 is determined to acquire a value of nearly Vcc/2 as mentioned below.

That is to say, the base of the constant-current transistor Q₄₀ is biased by a biasing circuit 106 consisting of a transistor Q₄₁ and a resistor R₄₄. Since the biasing circuit 106 has been connected to the power-supply terminal T₂, a constant current which flows into the constant-current transistor Q₄₀ is dependent upon the power-supply voltage Vcc. Therefore, even when the power-supply voltage Vcc is varied, the d-c output level at the output terminal T₃ follows the value Vcc/2 which varies in response to the changes in the power-supply voltage Vcc.

On the other hand, the output signal of the initial-stage amplifier circuit 104 produced across the resistor R₄₀ is amplified by a drive amplifier circuit consisting of Darlington-connected transistors Q₆ and Q₇, a resistor R₁, a phase compensating capacitor C₁₀₆, a diode-connected transistor Q₈, a resistor R₃, and a constant-current load transistor Q₄. The output of the drive amplifier circuit 107 is fed to Darlington-connected transistors Q₁₅ and Q₁₆ in the push-pull output amplifier circuit 108, as well as to complementary-connected transistors Q₁₅ and Q₁₄.

The emitter of the transistor Q₁₃ is connected to an idling current adjusting circuit 109 made up of diodes Q₁₀ to Q₁₂, and transistors Q₉ and Q₅, such that the crossover distortion of the push-pull output amplifier circuit 108 can be reduced.

The base of the constant-current load transistor Q₄ of the drive amplifier circuit 107 and the base of the transistor Q₅ of the idling current adjusting circuit 109 have been connected to the base of the transistor Q₃ of the biasing circuit 110. The biasing circuit 110 is composed of transistors Q₁, Q₂, and a resistor R₄₅, and is operated by a nearly constant operation voltage from a constant-voltage regulator 102. Therefore, a d-c biasing current flowing into the drive amplifier circuit 107 and a d-c biasing current flowing into a push-pull output amplifier circuit 108 are maintained at nearly constant values despite the changes in power-supply voltage Vcc.

A detector circuit 2 for detecting the operation of the output transistor Q₁₆ has been constructed by means of transistors Q₄₂ and Q₄₄ and resistors R₆ to R₈ and R₄₈.

One end of the resistor R₄₈ and the base of the transistor Q₄₄ are connected to the collector of the transistor Q₄₅. The other end of the resistor R₄₈ and the collector of the transistor Q₄₄ are connected to the base of the control transistor Q₄₆. The emitter of the control transistor Q₄₆ has been connected to one end of the resistor R₈. The collector of the control transistor Q₄₆ is connected to the collector of the transistor Q₄₇. The bases of the transistors Q₄₅ and Q₄₇ are connected to the base of the transistor Q₄₈ in the biasing circuit 112.

The biasing circuit 112 further includes a transistor Q₄₉ and a resistor R₄₉. To one end of the resistor R₄₉ is supplied the power-supply voltage Vcc via a power-supply terminal T₂.

The collector of the control transistor Q₄₉ has been connected to the base of other transistor Q₂₂.

The collector of the transistor Q₂₂ in the power amplifier circuit 103 and the collector of the transistor Q₂₂' in the power amplifier circuit 103' are connected to a capacitor C₁ via the terminal T₈. Since the transistors Q₂₂ and Q₂₂' are usually rendered non-conductive, the capacitor C₁ has been electrically charged up to a d-c operation voltage Vcc/2 supplied from the output terminals T₃, T₃' due to resistors R₁₂, R₁₂' and R₅₀.

The terminal T₈, on the other hand, is connected to an input of a Schmidt trigger circuit 5 via a resistor R₁₃. The Schmidt trigger circuit 5 is constructed, as shown, by means of transistors Q₂₀, Q₂₁ and resistors R₁₄ to R₁₇. The output of the Schmidt trigger circuit will be obtained at a connection point between the resistor R₁₆ and the resistor R₁₇. The resistance of the resistor R₁₄ has been set to be, for example, 10 KΩ which is greater than the resistance (for example, 2 KΩ) of the resistor R₁₅, such that the output of the trigger circuit acquires a low level when the capacitor C₁ has been electrically charged.

The detector circuit 2, on the other hand, has been so designed that the detection level l lies between the operation locus l₂ of the output transistor Q₁₆ and the a-c ASO region ASO_{AC}, like the case of FIG. 4.

Namely, the constant current Io which flows into the transistor Q₄₅ is given by the following relation, $$Io = \frac{Vcc - (V_{BEQ48} + V_{BEQ49})}{R_{49}} \quad (1)$$

where Vcc represents a power-supply voltage Vcc, $V_{BEQ48}$ and $V_{BEQ49}$ represent foward voltages across the base and emitter of the transistors Q₄₈ and Q₄₉, and R₄₉ denotes a resistance of the resistor R₄₉. When the resistors R₆ to R₈ satisfy a requirement $R_6 >> R_7 >> R_8$, the voltage $V_{BEQ46}$ appearing across the base and emitter of the control transistor Q₄₆ is given by the following relation, like the equation (3) mentioned earlier, $$V_{BEQ46} \approx I_{CQ16} \cdot R_8 + \frac{R_7}{R_6} (V_{CEQ16} - V_{BEQ42} - V_{BEQ43}) \quad (2)$$
$$+ Io(R_7 - R_{48}) + V_{BEQ44}$$

where $V_{BEQ46}$ and $V_{BEQ47}$ represent forward voltages across the base and emitter.

From the above equations (1) and (2), $$V_{BEQ46} \approx I_{CQ16} \cdot R_8 + \frac{R_7}{R_6} (V_{CEQ16} - V_{BEQ42} - V_{BEQ43}) + \quad (3)$$
$$\frac{(R_7 - R_{48})}{R_{49}} [Vcc - (V_{BEQ48} + V_{BEQ49})] + V_{BEQ44}$$

The resistances have been set as mentioned below, so that the resistors R₆ to R₈ satisfy the requirement $R_6 >> R_7 >> R_8$, the resistors R₇ and R₄₈ satisfy the requirement $R_{48} = 2R_7$, and the resistors R₆, R₇, R₄₈ and R₄₉ satisfy the requirement $$\frac{R_7}{R_6} \approx \frac{(R_7 - R_{48})}{R_{49}}$$

$R_6 = 10$ KΩ (semiconductor resistor),
$R_7 = 100$ Ω (semiconductor resistor),
$R_8 = 15$ mΩ (equivalent resistance in the layer of aluminum wiring),
$R_{48} = 200$ Ω (semiconductor resistor),
$R_{49} = 10$ KΩ (semiconductor resistor).

Accordingly, if the base/emitter junction characteristics of the transistors $Q_{42}$ and $Q_{43}$ are equal to the base/emitter junction characteristics of the transistors $Q_{48}$ and $Q_{49}$, the current-limiting equation (conditions in which a relation $V_{BEQ46} > V_{BEQ44}$ is satisfied, and the control transistor $Q_{46}$ is rendered conductive) deriving from the equation (3) can be written as follows:

$$I_{CQ16} \frac{R_7}{R_6 \cdot R_8} (V_{cc} - V_{CEQ16}) \quad (4)$$

As will be obvious from the current-limiting equation (4), the dispersion in base/emitter junction characteristics of the transistors $Q_{48}$ and $Q_{49}$ in the biasing circuit 112, and the temperature dependency, are cancelled by those of the transistors $Q_{42}$ and $Q_{43}$ in the detector circuit 2, whereby it is made possible to obtain a line of detection level irrespective of the base/emitter junction characteristics of the transistors.

Quite in the same manner as the case of FIG. 4, just before the output of the output transistor $Q_{16}$ of the power amplifier circuit 103 exceeds the detection level 1 connecting the two operation points $P_1$ and $P_2$, the transistor $Q_{22}$ is rendered conductive according to the equation (4), whereby the electric charge stored in the capacitor $C_1$ at the terminal $T_8$ is discharged through the transistor $Q_{22}$. Hence, the output of the Schmidt trigger circuit 5 at a connection point between the resistor $R_{16}$ and the resistor $R_{17}$ acquires a high level to render the transistors $Q_{23}$, $Q_{24}$ conductive, provided the power-supply voltage Vcc is of a sufficient value.

The transistors $Q_{23}$, $Q_{24}$ rendered conductive causes the transistors $Q_1$, $Q_2$ and $Q_3$ in the biasing circuit 110 to be nonconductive. Therefore, since the transistor $Q_4$ constituting the constant-current load of the drive amplifier circuit 107 is rendered nonconductive, the transistors $Q_{15}$ and $Q_{16}$ of the push-pull output amplifier circuit 108 are rendered nonconductive.

Since the transistor $Q_3$ of the biasing circuit 110 has also been rendered nonconductive, the transistor $Q_5$ of the idling current adjusting circuit 109 is rendered nonconductive, and the transistors $Q_{13}$ and $Q_{14}$ of the push-pull output amplifier circuit 108 are rendered nonconductive, as well.

Thus, the base currents of the output transistors $Q_{16}$ and $Q_{14}$ of the push-pull output amplifier circuit 108 are interrupted, and the operations of the output transistors $Q_{16}$ and $Q_{14}$ are confined within the restriction level $l'$, making it possible to prevent them from being destroyed.

In this case, quite in the same manner, the transistor which is rendered nonconductive in the biasing circuit 110, causes the output transistors $Q_{16}'$ and $Q_{14}'$ in the push-pull output amplifier circuit 108' to be nonconductive, too.

On the other hand, serious disadvantage will be presented as mentioned below when one terminal $T_3$ of two output terminals $T_3$, $T_3'$ of a pair of power amplifier circuits 103, 103' constituting the BTL circuit is short-circuited to the ground potential GND in a d-c manner, and when the output transistors $Q_{16}$ and $Q_{14}$ of one power amplifier circuit 103 are rendered nonconductive, but when the output transistors $Q_{16}'$ and $Q_{14}'$ of the other power amplifier circuit 103' are not rendered nonconductive.

In other words, when the output transistors $Q_{16}'$ and $Q_{14}'$ of the other power amplifier circuit 103' are not rendered nonconductive, a d-c voltage of about Vcc/2 appears on the output terminal $T_3'$ while the output terminal $T_3$ of the power amplifier circuit 103 is short-circuited to the ground potential GND in a d-c manner. Accordingly, a d-c current flows into a voice coil of the speaker SP connected across the terminals $T_3$ and $T_3'$, so that the speaker SP may be damaged.

According to the embodiment of the present invention, on the other hand, the output transistors $Q_{16}$, $Q_{14}$, $Q_{16}'$ and $Q_{14}'$ of the two power amplifier circuits 103 and 103' are all rendered nonconductive under the abovementioned conditions, making it possible to prevent the speaker SP from being damaged.

What is claimed is:

1. A transistor power amplifier circuit comprising:
    a first output transistor disposed between a first potential and a first output terminal;
    a second output transistor disposed between said first output terminal and a second potential;
    a drive circuit connected to said first and second output transistors for driving said first and second output transistors in a push-pull manner;
    an operation detector circuit for detecting the operation of said first output transistor;
    a level detector circuit for detecting the d-c voltage level of said first output terminal; and
    a control circuit which is controlled by the outputs of said operation detector circuit and said level detector circuit to control said drive circuit;
    wherein said operation detector circuit includes means for detecting when the operation of said first output transistor has deviated beyond a predetermined level which is set between a locus of an a-c operation of said first output transistor under a clipped operating condition thereof and an a-c safety operation region of said first output transistor, said level detector circuit including means for detecting a d-c voltage level of said first output terminal to determine when it is short-circuited to said second potential in a d-c manner, and said drive circuit including means responsive to an output of said control circuit in the case where the operation of said first output transistor deviates beyond said predetermined level or that said first output terminal is short-circuited to said second potential to restrict the operation of said first output transistor within a restriction level which is set within a d-c safety operation region of said first output transistor.

2. A transistor power amplifier circuit as set forth in claim 1, wherein said restriction level is set to a cut-off level of said first output transistor.

3. A transistor power amplifier circuit as set forth in claim 2, further comprising
    a third output transistor disposed between said first potential and a second output terminal;
    a fourth output transistor disposed between said second output terminal and said second potential thereby to execute a push-pull operation together with said third output transistor; and
    a speaker of which the terminals are directly connected to said first and second output terminals, wherein said first and third output transistors are simultaneously controlled to the cut-off levels in accordance with the output of said control circuit during a period in which said first output terminal is short-circuited to said second potential in a d-c manner.

4. A transistor power amplifier circuit as set forth in claim 2 or claim 3, further comprising a constant-voltage means disposed between said first potential and said second potential, wherein said constant-voltage means prohibits an erroneous operation of said control circuit before the difference between said first potential and said second potential reaches a predetermined value of said constant-voltage means.

5. A transistor power amplifier circuit comprising:
   a first output transistor disposed between a first potential and a first output terminal;
   a second output transistor disposed between said first output terminal and a second potential;
   a drive circuit for driving said first and second output transistors in a push-pull manner;
   an operation detector circuit for detecting when the operation of said first output transistor has deviated beyond a predetermined level which is set between a locus of an a-c operation of said first output transistor under a clipped operation condition thereof and an a-c safety operation region of said first output transistor;
   a level detector circuit for detecting the d-c voltage level of said first output terminal; and
   a control circuit which is controlled by the outputs of said operation detector circuit and said level detector circuit to control said first output transistor; wherein said control circuit includes means to control said first output transistor into the cut-off region thereof when the operation of said first output transistor deviates beyond said predetermined level of said operation detector circuit or when said first output terminal is short-circuited to said second potential in a d-c manner.

6. A transistor power amplifier circuit as set forth in claim 5, further comprising another control circuit which detects the difference between said first potential and said second potential and prohibits an erroneous operation of said control circuit before said difference reaches a predetermined value.

7. A transistor power amplifer circuit as set forth in claim 6, wherein said level detector circuit comprises a resistor connected between said first output terminal and an input terminal of said control circuit and a capacitor connected between said input terminal of said control circuit and said second potential, said control circuit being provided in the form of a Schmidt trigger circuit, and said other control circuit comprises a constant-voltage means one end of which is connected to said first potential, a first control transistor having a base which is connected to another end of said constant-voltage means and a second control transistor having a base connected to an output terminal of said control circuit, an emitter connected to said second potential through the collector-emitter path of said first control transistor and a collector from which a control signal for controlling said first output transistor into the cut-off region thereof is generated.

8. A transistor power amplifier circuit comprising:
   a phase separator circuit for producing two output signals of anti-phase relation in response to an input signal;
   a first drive circuit for amplifying one of said two output signals of said phase separator circuit;
   a second drive circuit for amplifying the other of said two output signals of said phase separator circuit;
   a first output transistor disposed between a first potential and a first output terminal and a second output transistor disposed between said first output terminal and a second potential, said first and second output transistors being driven by said first drive circuit in a push-pull manner;
   a third output transistor disposed between said first potential and a second output terminal and a fourth output transistor disposed between said second output terminal and said second potential, said third and fourth output transistors being driven by said second drive circuit in a push-pull manner;
   a speaker having terminals which are directly connected to said first and second output terminals;
   a first operation detector circuit for detecting when the operation of said first output transistor has deviated beyond a predetermined level which is set between a locus of an a-c operation of said first output transistor under a clipped operating condition thereof and an a-c safety operation region of said first output transistor;
   a second operation detector circuit for detecting when the operation of said third output transistor has deviated beyond a predetermined level which is set between a locus of an a-c operation of said third output transistor under a clipped operating condition thereof and an a-c safety operation of said third output transistor;
   a level detector circuit for detecting the d-c voltage levels of said first and second output terminals; and
   a control circuit which is controlled by the outputs of said first and second operation detector circuits and said level detector circuit thereby to control said first and third output transistors into the cut-off regions thereof when at least the operation of either one of said first and third output transistors deviates beyond said predetermined level in either one of said first and second operation detector circuits or when at least either one of said first and second output terminals is short-circuited to said second potential in a d-c manner.

* * * * *